(12) United States Patent
Kinzer et al.

(10) Patent No.: US 7,550,781 B2
(45) Date of Patent: Jun. 23, 2009

(54) INTEGRATED III-NITRIDE POWER DEVICES

(75) Inventors: Daniel M. Kinzer, El Segundo, CA (US); Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/056,794

(22) Filed: Feb. 11, 2005

(65) Prior Publication Data
US 2005/0189562 A1 Sep. 1, 2005

Related U.S. Application Data

(60) Provisional application No. 60/544,626, filed on Feb. 12, 2004.

(51) Int. Cl.
*H01L 29/772* (2006.01)
(52) U.S. Cl. ............... 257/183; 257/201; 257/506; 257/E29.089; 257/E29.249; 257/E29.296
(58) Field of Classification Search ........... 257/183, 257/200, 201, 506, E29.089, E29.249, E29.296
See application file for complete search history.

(56) References Cited

U.S. PATENT DOCUMENTS

| | | | |
|---|---|---|---|
| 4,424,525 A | | 1/1984 | Mimura |
| 4,511,813 A | | 4/1985 | Pan |
| 5,387,880 A | * | 2/1995 | Kobayashi ............ 330/296 |
| 5,808,332 A | | 9/1998 | Kohno et al. |
| 6,465,814 B2 | | 10/2002 | Kasahara et al. |
| 6,492,669 B2 | | 12/2002 | Nakayama et al. |
| 6,690,042 B2 | | 2/2004 | Khan et al. |
| 2002/0041003 A1 | * | 4/2002 | Udrea et al. ............ 257/502 |
| 2002/0171405 A1 | * | 11/2002 | Watanabe ............... 323/282 |

FOREIGN PATENT DOCUMENTS

JP 2003228320 8/2003

OTHER PUBLICATIONS

Complete Guide to Semiconductor Devices—Second Edition—Kwok K. NG—pp. 175-177 (2007).
International Search Report Dated Apr. 28, 2006 from Corresponding PCT Application No. PCT/US05/04615.

* cited by examiner

*Primary Examiner*—Lex Malsawma
(74) *Attorney, Agent, or Firm*—Farjami & Farjami LLP (57) ABSTRACT

A III-nitride based integrated semiconductor device which includes at least two III-nitride based semiconductor devices formed in a common die.

21 Claims, 11 Drawing Sheets

Figure 8C

INTEGRATED III-NITRIDE POWER DEVICES

RELATED APPLICATION

The present application is based on and claims benefit of U.S. Provisional Application No. 60/544,626 filed Feb. 12, 2004, entitled III-NITRIDE BIDIRECTIONAL SWITCH, to which a claim of priority is hereby made and the disclosure of which is hereby incorporated by this reference.

FIELD OF THE INVENTION

The present invention relates to power semiconductor devices and more particularly to integrated power semiconductor devices.

BACKGROUND OF THE INVENTION

Figure 1A:
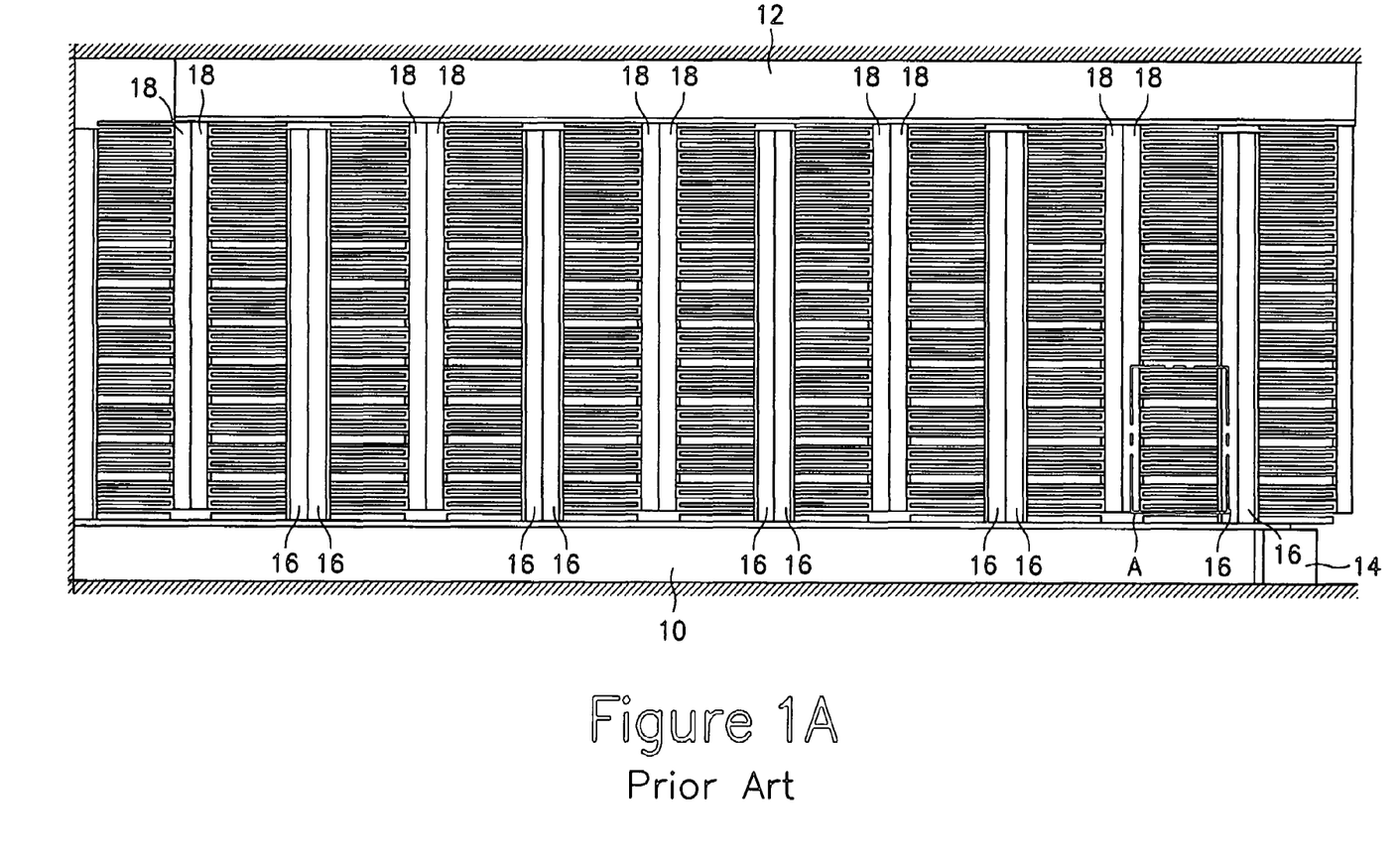
FIG. 1A is a top plan view of a discrete III-nitride power device according to the prior art.

Referring to FIG. 1A, a known, discrete high electron mobility transistor (HEMT) may include drain pad 10, source pad 12, and gate pad 14. Drain pad 10 is electrically connected to a plurality of drain runners 16, and source pad 12 is electrically connected to a plurality of source runners 18. Usually, drain pad 10 and source pad 12, and runners 16, 18 are arranged parallel to one another. In addition, in one conventional arrangement, drain runners 16 and source runners 18 are alternated in order to distribute current evenly through drain pad 10 and source pad 12. In a device according to FIG 1A, the area between each two opposing runners 16, 18 is an active area.

Figure 1B:
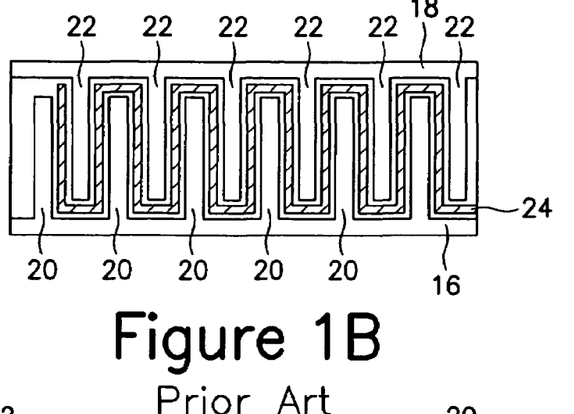
FIG. 1B is an enlarged view of portion A of an active area of the device shown in FIG. 1A.

Referring next to FIG. 1B, a portion A of an active area of the device of FIG. 1A is enlarged to illustrate a plurality of drain fingers 20 that are electrically connected and extend away from each drain pad 10, and a plurality of source fingers 22 that are electrically connected to and extend away from each source pad 12. It should be noted that drain fingers 20 and source fingers 22 alternate along drain pad 16 and source pad 18, whereby an interdigitated configuration is attained. Gate electrode 24 meanders through the space between drain pad 16, drain fingers 20, source pad 18, and source fingers 22, and, although not shown, is connected to a gate runner which electrically connects gate electrode 24 to gate pad 14.

Figure 1C:
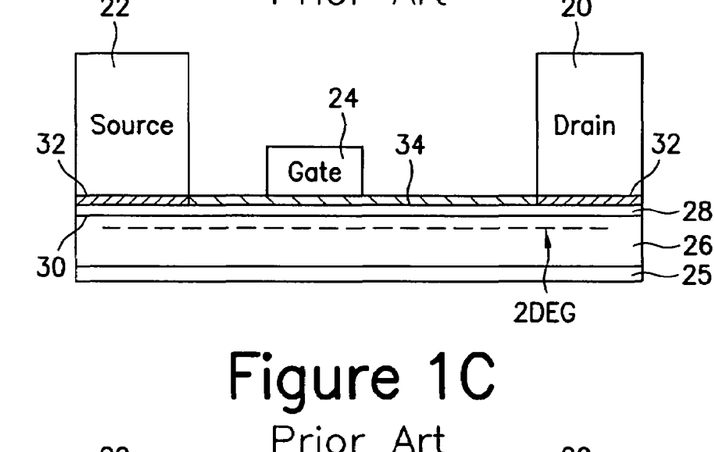
FIG. 1C is a cross-sectional view of an example of a device according to the prior art taken along line B-B in FIG. 1B viewed in the direction of the arrows.

Referring next to FIG. 1C, a typical HEMT includes substrate 25, which may be formed from GaN, Si, SiC, or Sapphire, first semiconductor body 26 formed from one III-nitride semiconductor such as GaN and disposed over substrate 25, and a second semiconductor body 28 formed of another III-nitride semiconductor of a different band gap such as AlGaN disposed over first semiconductor body 26. First semiconductor body 26 and second semiconductor body 28 form heterojunction 30, which due to piezoelectric polarization forms a two dimensional electronic gas (2DEG) at or near heterojunction 30. The 2DEG so formed is highly conductive and serves as a channel for conducting current between a source finger 20 and a drain finger 22. It should be noted that in a typical device source fingers 22 and drain fingers 20 are connected to second semiconductor body 28 by a highly conductive ohmic contact layer 32.

In the device shown by FIG. 1C, gate electrode 24 is insulated form second semiconductor body 28 by gate insulation layer 34. In another variation, gate electrode 24 can make a schottky contact with second semiconductor body 28, as seen, for example, in FIG. 1D.

Figure 1D:
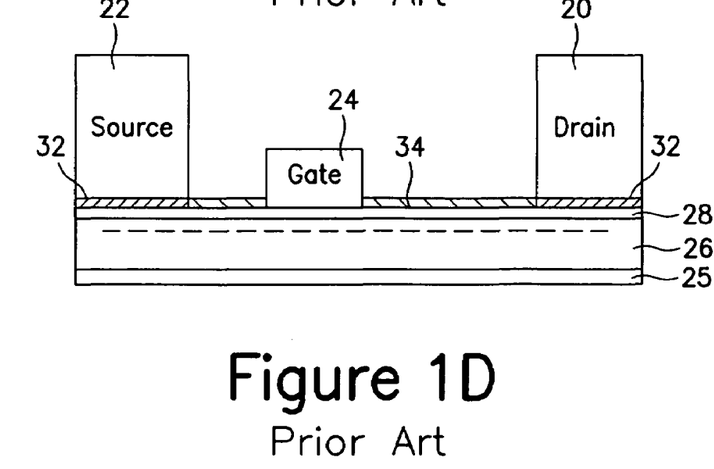
FIG. 1D is a cross-sectional view of another example of a device according to the prior art taken along line B-B in FIG. 1B viewed in the direction of the arrows.
Figure 1E:
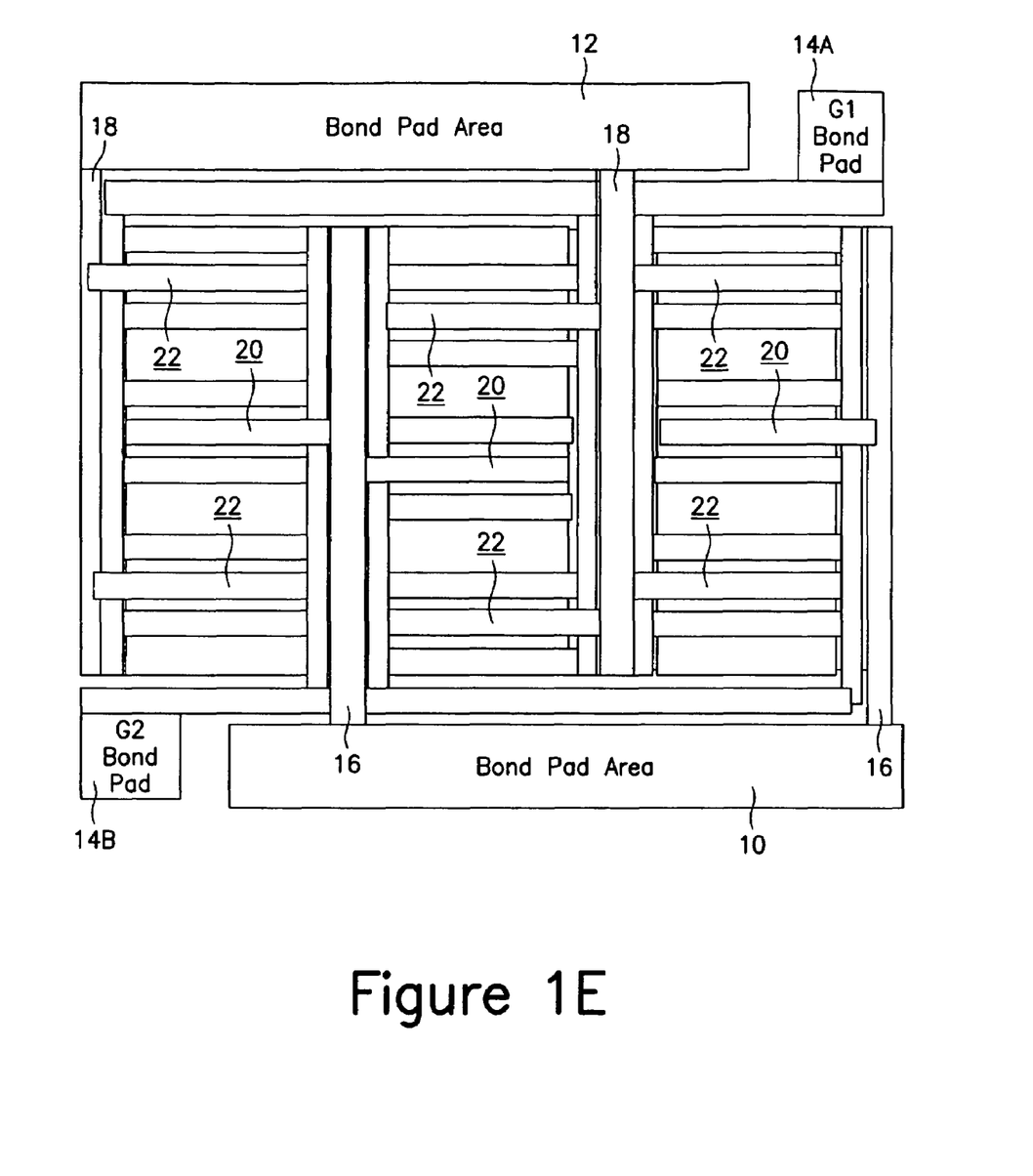
FIG. 1E shows a top plan view of a bidirectional III-nitride device which includes two gate electrodes.

The devices illustrated by FIG. 1C and FIG. 1D are depletion mode devices, meaning that the device is nominally on and the activation of gate electrode 24 in each device by application of an appropriate voltage interrupts the 2DEG to turn the device off. Enhancement mode HEMTs are shown in U.S. Provisional Application Ser. No. 60/544,626, filed Feb. 12, 2004, the disclosure of which is incorporated herein by reference and U.S. patent application Ser. No. 11/056,062, entitled III-Nitride Bidirectional Switch, filed in the name of Daniel M. Kinzer and Robert Beach concurrently with the present application, the disclosure of which is incorporated by reference. Bidirectional devices can include one gate electrode, or two gate electrodes. FIG. 1E illustrates a bidirectional discrete device which includes two gate electrodes.

The prior art devices described with reference to FIGS. 1A-1E are discrete devices, meaning that each of these devices occupies a single, discrete semiconductor die. Due to the high breakdown voltage and current carrying capabilities III-nitride power devices occupy only a small area on a die. Thus, III-nitride-based semiconductor power devices are very small compared to silicon-based devices.

As with other devices, III-nitride semiconductor power devices need to be packaged so that they may be used in an electronic application, such as a power supply application, or motor control application. In a semiconductor package containing a III-nitride-based power semiconductor device, the packaging elements are thought to contribute the most to the overall size of the package due to the small size of the III-nitride power devices. Because many power applications require more than one power semiconductor device, it is expected that packaging, not the die, will contribute the most to the amount of space that is occupied by III-nitride-based power semiconductor packages.

SUMMARY OF THE INVENTION

According to the present invention an integrated device includes two or more III-nitride power semiconductor devices which are formed in a single common semiconductor die. As a result, in applications requiring more than one power device, an integrated device according to the present invention can be packaged in a common package, which results in space saving among other advantages.

A device according to the first embodiment of the present invention is an integrated device that includes two III-nitride-based power devices connected in a half-bridge configuration.

A device according to the second embodiment of the present invention is an integrated device that includes six III-nitride-based power devices connected to form three half-bridges for use in, for example, a three phase power application.

A device according to the third embodiment of the present invention is an integrated device that includes four III-nitride-based power devices connected in a H-bridge configuration.

A device according to the fourth embodiment of the present invention is an integrated device which includes two III-nitride based bidirectional devices connected to form a half-bridge and two III-nitride based devices having a common drain for use in, for example, boost converter applications.

A device according to the fifth embodiment of the present invention is an integrated device which include four III-nitride based schottky diodes in a full bridge configuration.

Other features and advantages of the present invention will become apparent from the following description of the invention which refers to the accompanying drawings.

DETAILED DESCRIPTION OF THE FIGURES

Figures 2, 7:
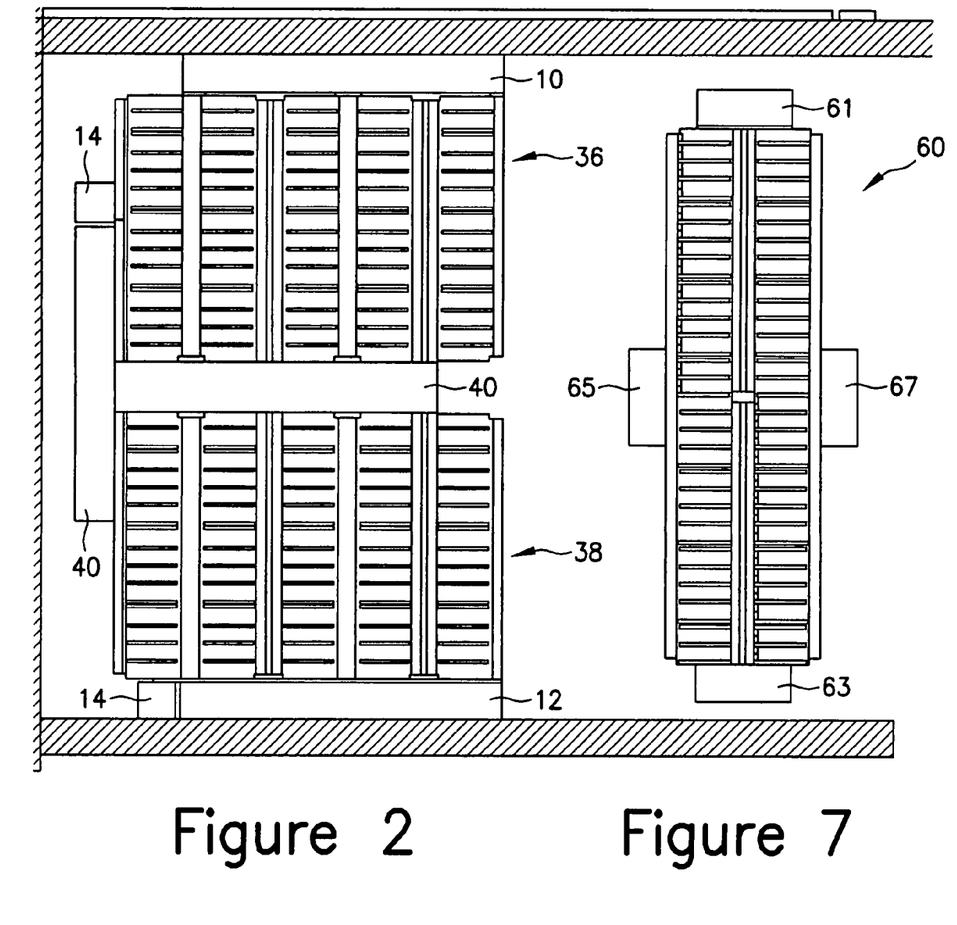
FIG. 2 is a top plan view of an integrated half-bridge device according to the first embodiment of the present invention.
FIG. 7 shows a top plan view of an integrated III-nitride based schottky bridge according to the fifth embodiment of the present invention.

Referring to FIG. 2, an integrated device according to the first embodiment of the present invention includes two HEMTs formed on one die and interconnected to form a half-bridge. The term integrated as used herein means that the devices are formed in a common die. Specifically, an integrated device according to the first embodiment includes a high side HEMT 36, which includes drain pad 10, and gate pad 14, and a low side HEMT 38, which includes source pad 12 and gate pad 14. According to the present invention high side HEMT 36 and low side HEMT 38 are formed in a single die. Thus, a device according to the first embodiment can be packaged together, thereby saving space in a power application.

It should be noted that to form a half-bridge the drain pad of low side HEMT 38 and the source pad of high side HEMT 36 are combined into a single pad, switched node pad 40, which serves as the output pad for the half-bridge.

Figure 3:
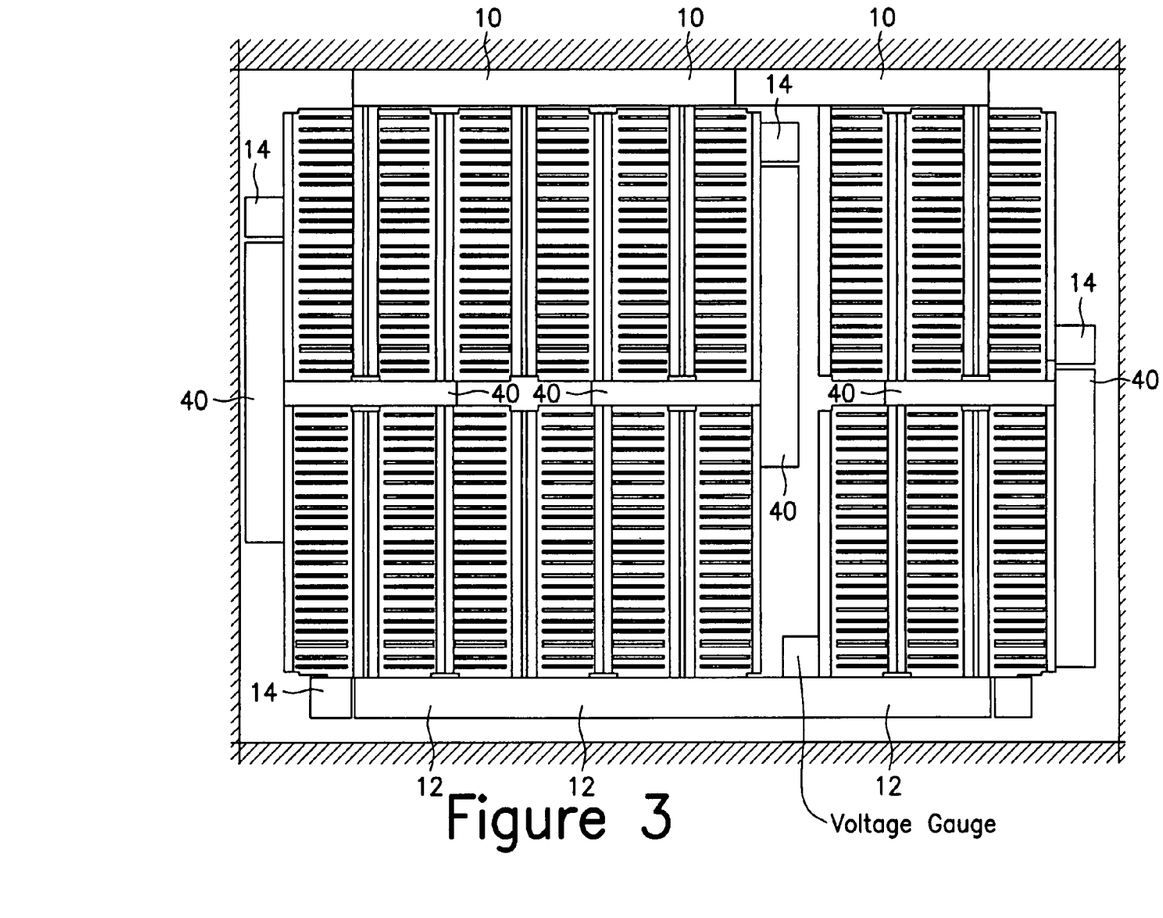
FIG. 3 is a top plan view of an integrated three-phase device according to the second embodiment of the present invention.

Referring next to FIG. 3, an integrated device according to the second embodiment may include three half-bridges formed in a single die. As seen in FIG. 3, drain pads 10 of high side HEMTs 36 are interconnected to form a single pad, bus pad 42, and source pads 12 of low side HEMTs 38 are interconnected to form a single pad, ground pad 44, for the three phase bridge according to the second embodiment of the present invention.

Figure 4:
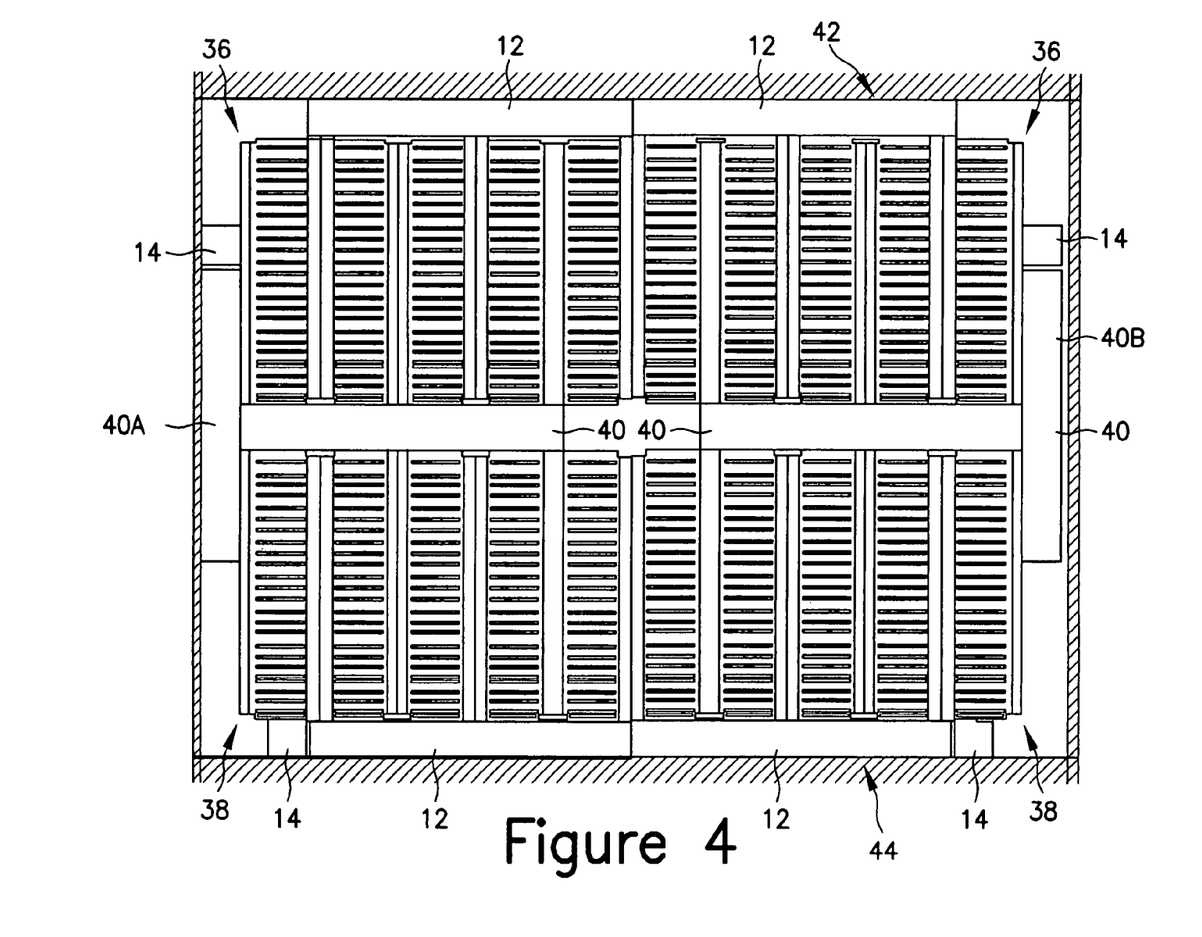
FIG. 4 is a top plan view of an integrated H-bridge device according to the third embodiment of the present invention.

Referring next to FIG. 4, an integrated device according to the third embodiment includes four HEMTs formed in a single die and integrated into an H bridge configuration. In this embodiment drain pads 10 of high side HEMTs 36 are connected to one another to form bus pad 42, source pads 12 of low side HEMTs are connected together to form ground pad 44. The source pad of one high side HEMT 36 is common with the drain pad of one low side HEMT 38 to form a first output pad 40A, and the source pad of the other high side HEMT 36 is common with the drain pad of the other low side HEMT 38 to form second output pad 40B.

Figure 5:
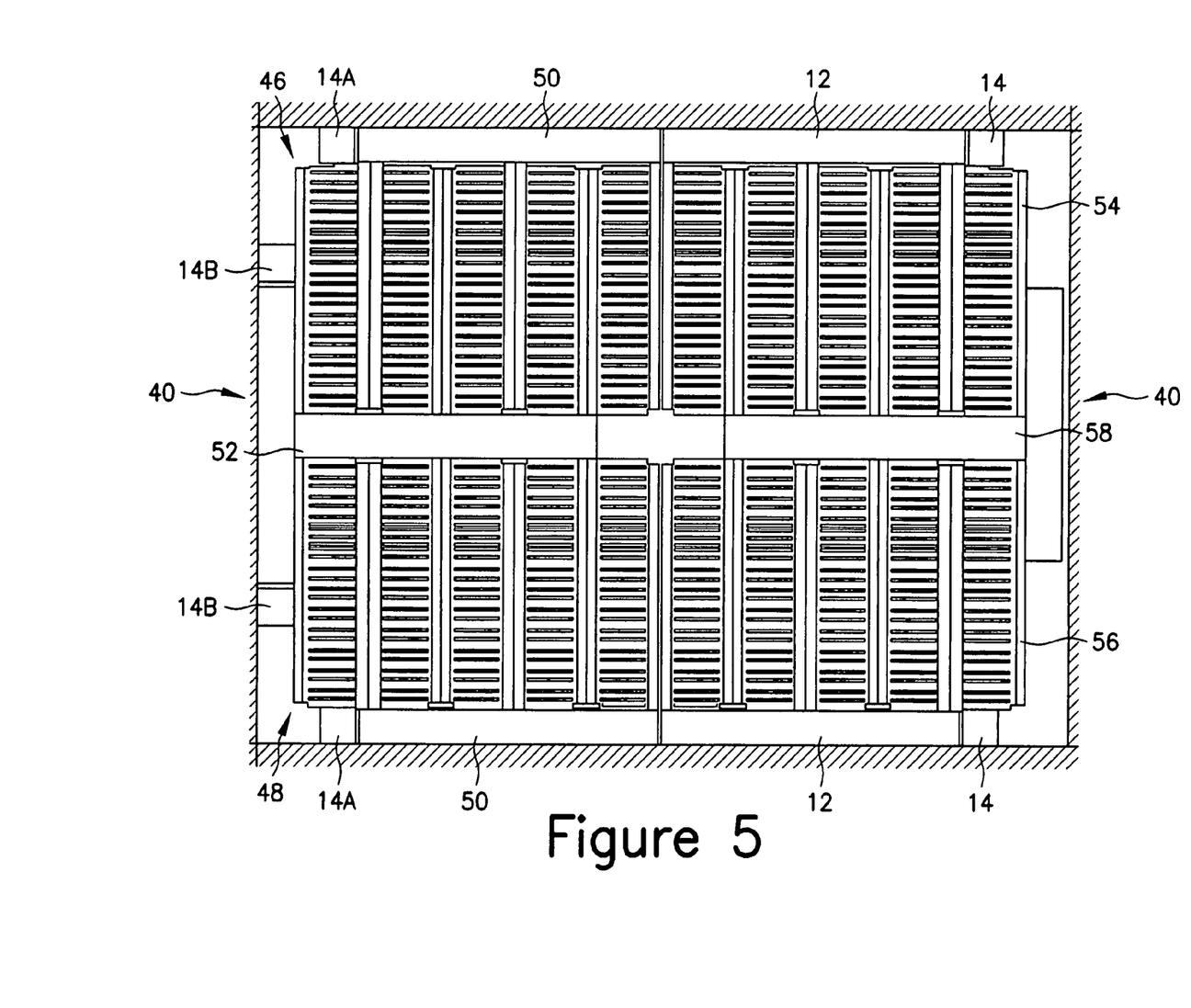
FIG. 5 is a top plan view of an integrated device according to the fourth embodiment of the present invention, which includes two III-nitride based bidirectional devices connected to form a half-bridge and two III-nitride based devices having a common drain.

Referring next to FIG. 5, an integrated device according to the fourth embodiment of the present invention may include two bidirectional HEMTs integrated in a half-bridge configuration. That is, one bidirectional HEMT is a high side device 46 and the other is low side device 48. It should be noted that each bidirectional HEMT in the fourth embodiment includes two gate pads 14A, 14B. Also, it should be noted that due to bidirectionality, HEMTs 36, 38 in the fourth embodiment only include power pads 50, rather than source pads and drain pads. As seen in FIG. 5, one power pad 52 is common to both bidirectional HEMTs, and serves as the switched output pad 40.

A device according to the fourth embodiment includes first HEMT 54 and second HEMT 56 integrated to have a common drain pad 58. Thus, according to the fourth embodiment, a device can be formed which is the integration of two integrated devices. A device according to the fourth embodiment can be used to form a bridgeless boost converter.

Figure 6A:
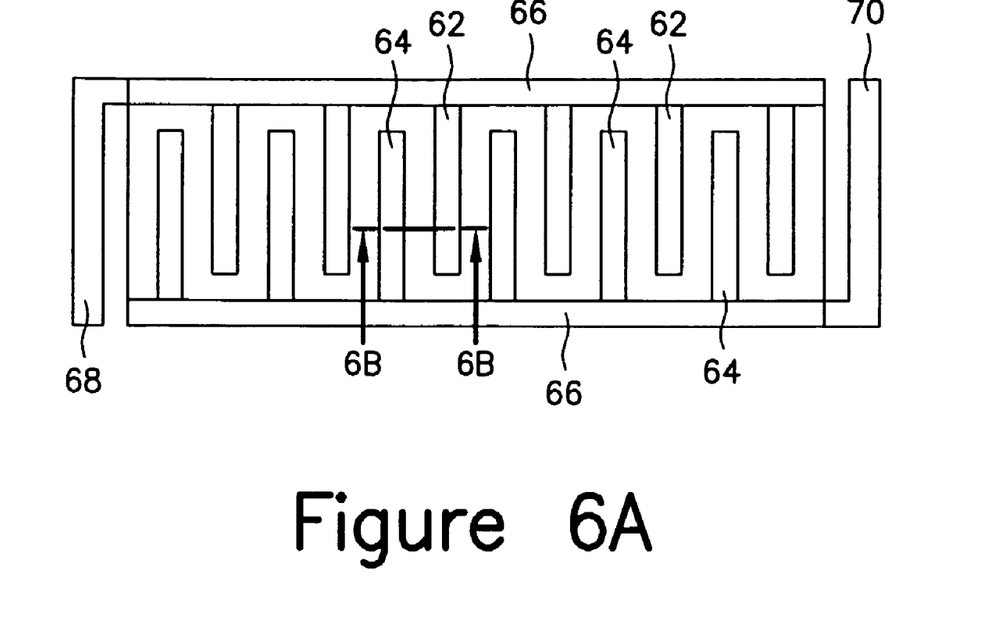
FIG. 6A shows a top plan view of a III-nitride schottky device according to prior art.
Figure 6B:
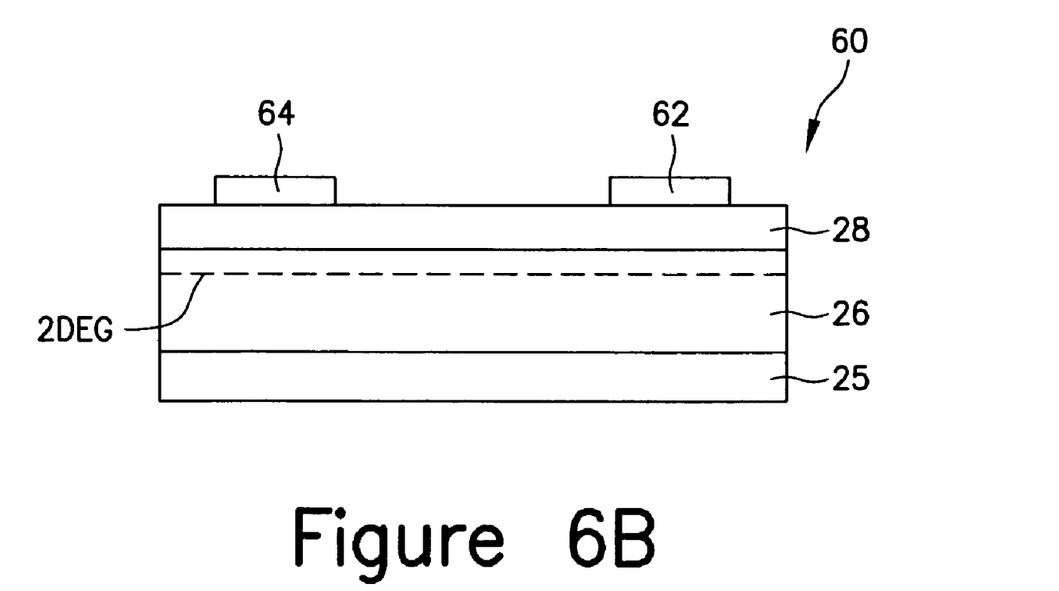
FIG. 6B shows a cross-sectional view of a schottky device according to the prior art taken along line 6B-6B in FIG. 6A and viewed in the direction of the arrows.

III-nitride semiconductor systems can also be used for forming diodes, such as schottky diodes. Referring for example to FIGS. 6A, 6B in which like numerals identify like numbers, a schottky diode 60 in III-nitride system does not include a gate, but rather includes anode electrode 62, which makes a schottky contact with second semiconductor body 28, and cathode electrode 64 which makes an ohmic contact with second semiconductor body 28. It should be noted that similar to a HEMT, anode electrodes 62, and cathode electrodes 64 are connected to respective runners 66 which are in turn electrically connected to anode pad 68 and cathode pad 70.

Referring to FIG. 7, an integrated device according to the fifth embodiment is a schottky bridge that includes four III-nitride schottky diodes that are arranged in a full-bridge configuration. Specifically, anode pads of the first two schottky devices are integrated to form a common anode pad 61, cathode pads of the second two schottky devices are integrated to form a common cathode pad 63, and the cathode pad of each of the first two schottky devices is integrated with the anode pad of one of the other two second schottky devices to form a third common pad 65, and a fourth common pad 67, whereby a schottky bridge is realized.

Figure 8A:
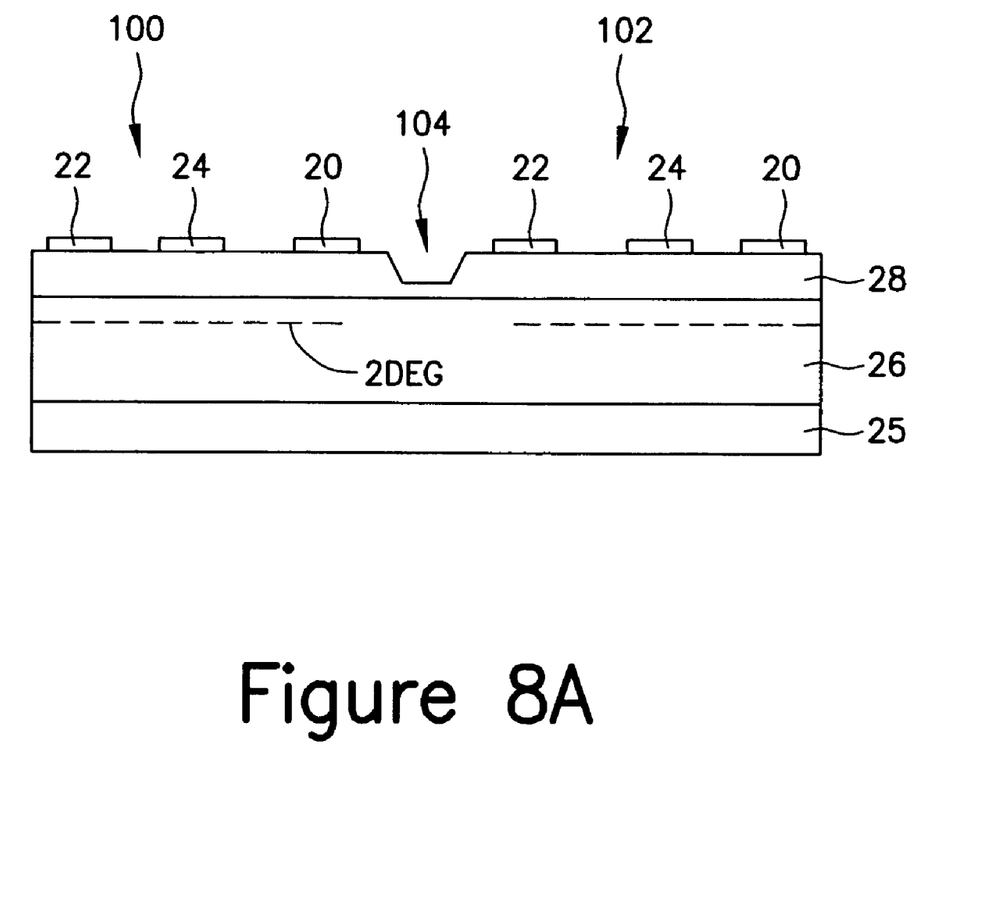
FIGS. 8A-8C illustrate integrated devices according to the present invention each with a feature for attaining electrical isolation between the two devices.
Figure 8B:
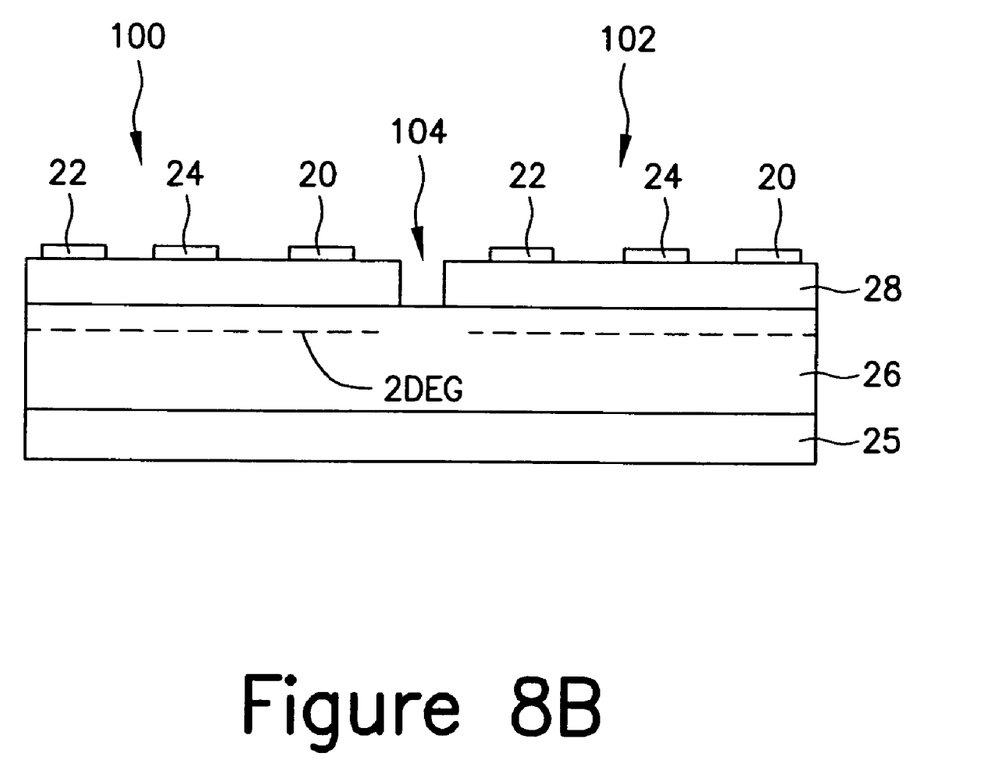

It should be noted that in an integrated device according to the present invention, because two or more devices are formed in one die, there may be a need for electrically isolating the devices. To achieve isolation, all or a portion of second semiconductor body 28 may be removed to interrupt the 2DEG whenever desired in order to achieve electrical isolation. Thus, for example, when in an integrated device according to the present invention, two HEMTs 100, 102 are found in a common die, a recess 104 can be formed in second semiconductor body 28 to a depth that will cause an interruption in the 2DEG and thus electrically isolates the two devices as illustrated in FIG. 8A. Recess 104 can be extended through second semiconductor body 28 to first semiconductor body 26 as illustrated in FIG. 8B.

Figure 8C:
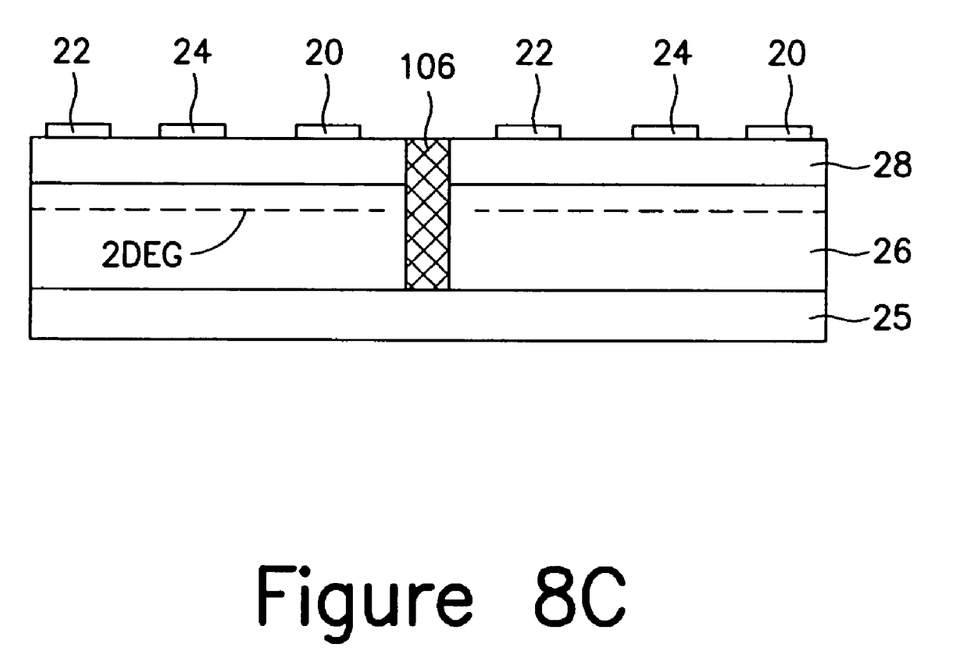

Alternatively, as seen, for example, in FIG. 8C, second semiconductor layer 28 may include an implanted region 106 that includes crystal damage to first and second semiconductor bodies 26, 28 which causes an interruption in the 2DEG at selected locations between devices 100, 102 to attain electrical isolation between the same. Once an isolated portion of the 2DEG is interrupted, the high resistivity of the first semiconductor body 26 can be relied on for isolation. Thus, two or more devices may be formed on a single die.

It should be noted that an HEMT or a schottky device as described herein as prior art, is preferred as a building block for an integrated device according to the present invention. However, it should be understood that the present invention is not limited to the configurations disclosed herein.

Furthermore, although a GaN/AlGaN heterojunction is preferred, other III-nitride combinations are within the scope of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An integrated semiconductor device comprising:
a first III-nitride based semiconductor device that includes a first pad and a second pad;
a second III-nitride based semiconductor device that includes a first pad and a second pad, said second pad of said second III-nitride based semiconductor device being interconnected to form a single pad with either said first pad of said first III-nitride based semiconductor device or said second pad of said first III-nitride based semiconductor device;
a common die; and
an isolation feature formed in said common die to electrically isolate said first and second semiconductor devices from one another, said isolation feature directly overlying a substrate in said common die;
wherein said first III-nitride based semiconductor device and said second III-nitride based semiconductor device are formed in said common die and electrically connected to one another through said single pad to form an integrated device.

2. An integrated device according to claim 1, wherein said first and said second semiconductor devices are high electron mobility transistors.

3. An integrated device according to claim 1, wherein said first and said second semiconductor devices are integrated to form a half-bridge.

4. An integrated device according to claim 3, wherein said single is a switched node pad electrically connected and common to both said first and said second III-nitride semiconductor devices.

5. An integrated device according to claim 1, further comprising a third III-nitride semiconductor device and a fourth III-nitride semiconductor device formed in said common die.

6. A integrated device according to claim 5, wherein said first, said second, said third, and said fourth semiconductor devices are high electron mobility transistors interconnected to form an H bridge.

7. An integrated device according to claim 5, wherein said first, said second, mid third and said fourth semiconductor devices are schottky diodes interconnected to form a rectifier bridge.

8. An integrated device according to claim 5, wherein said first and said second devices are bidirectional and are interconnected to form a half-bridge, and said third and said fourth devices are high electron mobility transistors interconnected to have a common drain pad.

9. An integrated device according to claim 1, wherein said first and said second semiconductor devices are interconnected to form a first half-bridge, and further comprising third, fourth, fifth and sixth III-nitride semiconductor devices all formed in said common die, wherein said third and said fourth devices are connected to form a second half-bridge, and said fifth and said sixth semiconductor devices are connected to form a third half-bridge.

10. An integrated device according to claim 9, wherein said first, said second, said third, said fourth, said fifth, and said sixth devices are high electron mobility transistors.

11. An integrated device according to claim 9, wherein each half bridge includes a switched node pad common to its respective devices.

12. An integrated device according to claim 9, wherein each half bridge is connected to a common bus pad, and a common ground pad.

13. An integrated device according to claim 1, wherein said III-nitride semiconductor devices are formed in a die which includes a first III-semiconductor body of a first kind, and a second III-nitride semiconductor body of a second kind, said second III-nitride semiconductor body having a different band gap than said first III-nitride semiconductor body.

14. An integrated device according to claim 13, wherein each said semiconductor device includes a gate electrode.

15. An integrated device according to claim 14, wherein each said gate electrode makes a schottky contact with said second semiconductor body.

16. An integrated device according to claim 14, wherein each said gate electrode is insulated from said second semiconductor body by a gate insulation body.

17. An integrated device according to claim 13, wherein at least one of said semiconductor devices includes an ohmic electrode and a schottky electrode.

18. An integrated device according to claim 13, wherein said first III-nitride semiconductor body is comprised of GaN, and said second III-nitride semiconductor body is comprised of AlGaN.

19. An integrated device according to claim 13, wherein said isolation feature comprises a recess formed in said second III-nitride semiconductor body to electrically isolate said devices.

20. An integrated device according to claim 19, wherein said recess reaches said first III-nitride semiconductor body.

21. An integrated device according to claim 13, wherein said isolation feature includes an implanted region in said second III-nitride semiconductor body to isolate said semiconductor devices.

* * * * *

UNITED STATES PATENT AND TRADEMARK OFFICE
CERTIFICATE OF CORRECTION

| | | |
|---|---|---|
| PATENT NO. | : 7,550,781 B2 | |
| APPLICATION NO. | : 11/056794 | |
| DATED | : June 23, 2009 | |
| INVENTOR(S) | : Kinzer et al. | |

It is certified that error appears in the above-identified patent and that said Letters Patent is hereby corrected as shown below:

In the claims, column 5, line 45, --pad-- should be inserted before "is".

In the claims, column 5, line 56, "mid" should be changed to --said--.

Signed and Sealed this
First Day of November, 2011

David J. Kappos
*Director of the United States Patent and Trademark Office*